(12) United States Patent
Kujat et al.

(10) Patent No.: US 9,309,448 B2
(45) Date of Patent: Apr. 12, 2016

(54) ABRASIVE ARTICLES, METHOD FOR THEIR PREPARATION AND METHOD OF THEIR USE

(75) Inventors: Christof Kujat, Neustadt (DE); Yuzhuo Li, Heidelberg (DE); Kenneth Rushing, Ludwigshafen (DE)

(73) Assignee: BASF SE, Ludwigshafen (DE)

( * ) Notice: Subject to any disclaimer, the term of this patent is extended or adjusted under 35 U.S.C. 154(b) by 549 days.

(21) Appl. No.: 13/580,807

(22) PCT Filed: Jan. 19, 2011

(86) PCT No.: PCT/IB2011/050236
§ 371 (c)(1),
(2), (4) Date: Aug. 23, 2012

(87) PCT Pub. No.: WO2011/104639
PCT Pub. Date: Sep. 1, 2011

(65) Prior Publication Data
US 2012/0311935 A1 Dec. 13, 2012

Related U.S. Application Data

(60) Provisional application No. 61/307,453, filed on Feb. 24, 2010.

(51) Int. Cl.
*B24D 3/00* (2006.01)
*B24D 11/00* (2006.01)
*B24D 18/00* (2006.01)
*C09K 3/14* (2006.01)
*B24B 37/24* (2012.01)
*H01L 21/321* (2006.01)

(52) U.S. Cl.
CPC ............. *C09K 3/1436* (2013.01); *B24B 37/245* (2013.01); *B24D 11/001* (2013.01); *H01L 21/3212* (2013.01)

(58) Field of Classification Search
USPC .................... 51/298, 293, 307, 309
See application file for complete search history.

(56) References Cited

U.S. PATENT DOCUMENTS

| | | | |
|---|---|---|---|
| 5,624,303 A | | 4/1997 | Robinson |
| 7,527,662 B2 * | | 5/2009 | Sato ...................... B24B 37/245 451/540 |
| 2003/0121213 A1 | | 7/2003 | Takizawa et al. |
| 2008/0207091 A1 * | | 8/2008 | Jeng .......................... C09G 1/02 451/37 |
| 2009/0260297 A1 | | 10/2009 | Seth et al. |
| 2009/0289217 A1 * | | 11/2009 | Sato .......................... C09G 1/02 252/79.4 |
| 2010/0068883 A1 * | | 3/2010 | Shin .......................... C09G 1/02 438/693 |
| 2010/0095468 A1 * | | 4/2010 | Peretolchin .............. B24D 3/28 15/209.1 |

FOREIGN PATENT DOCUMENTS

| | | |
|---|---|---|
| CN | 101208398 | 6/2008 |
| CN | 101589198 | 11/2009 |
| JP | 2000-503601 A | 3/2000 |
| JP | 2003-520283 A | 7/2003 |
| JP | 2005-93785 A | 4/2005 |
| JP | 2007-514553 A | 6/2007 |
| TW | 538110 | 6/2003 |
| TW | 200902233 | 1/2009 |
| TW | 200951209 | 12/2009 |
| WO | WO 2005/053904 A1 | 6/2005 |
| WO | 2008 013226 | 1/2008 |
| WO | 2008 082177 | 7/2008 |
| WO | WO 2008/079743 A1 | 7/2008 |
| WO | WO 2009/128982 A2 | 10/2009 |

OTHER PUBLICATIONS

Chinese Office Action issued Sep. 17, 2014 in Patent Application No. 201180010888.1(English Translation only).
U.S. Appl. No. 13/580,039, filed Aug. 20, 2012, Raman, et al.
International Search Report Issued May 19, 2011 in PCT/IB11/50236 Filed Jan. 19, 2011.
U.S. Appl. No. 13/821,757, filed Mar. 8, 2013, Li, et al.
U.S. Appl. No. 13/821,759, filed Apr. 25, 2013, Noller, et al.
U.S. Appl. No. 13/821,746, filed Mar. 8, 2013, Li, et al.
U.S. Appl. No. 13/821,769, filed Mar. 8, 2013, Li et al.
Office Action issued Jan. 5, 2015 in Japanese Patent Application No. 2012-554448 (submitting English translation only).
Encyclopaedia Chimica 6, 1987, pp. 264-265.
Chinese Office Action issued Jan. 10, 2014 in Patent Application No. 201180010888.1 (English Translation only).

* cited by examiner

*Primary Examiner* — James McDonough
(74) *Attorney, Agent, or Firm* — Oblon, McClelland, Maier & Neustadt, L.L.P

(57) ABSTRACT

Abrasive articles containing solid abrasive particles (A) selected from the group consisting of inorganic particles, organic particles and inorganic-organic hybrid particles (a1) having an average primary particle size of from 1 to 500 nm as determined by laser light diffraction and having electron donor groups (a2) chemically bonded to their surface are provided. The said solid abrasive particles (A) are distributed throughout or on top of or throughout and on top of a solid matrix (B). A method for manufacturing abrasive articles and a method for processing substrates useful for fabricating electrical and optical devices are provided. The said methods make use of the said abrasive articles.

23 Claims, No Drawings

ABRASIVE ARTICLES, METHOD FOR THEIR PREPARATION AND METHOD OF THEIR USE

FIELD OF THE INVENTION

The present invention is directed to novel abrasive articles. Moreover, the present invention is directed to a novel method for preparing the novel abrasive articles. Last but not least, the present invention is directed to a novel method of using the novel abrasive articles.

CITED DOCUMENTS

The documents cited in the present application are incorporated by reference in their entirety.

BACKGROUND OF THE INVENTION

The fabrication of electrical devices, in particular, semiconductor integrated circuits (ICs); liquid crystal panels; organic electroluminescent panels; printed circuit boards; micro machines; DNA chips, micro plants and magnetic heads; preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; requires high precision methods which involve inter alia chemical mechanical polishing (CMP) steps using high-purity abrasive compositions. These abrasive compositions are customarily designated in the art as CMP agents or slurries.

Particular care has to be taken in the fabrication of ICs with LSI or VLSI. The semiconductor wafers used for this purpose include a semiconductor substrate such as silicon, into which regions are patterned for the deposition of different materials having electrically insulative, conductive or semiconductive properties.

In order to obtain the correct patterning, excess material used in forming the various layers on the substrates must be removed. Further, to fabricate functional and reliable ICs, it is important to have flat or planar semiconductor wafer surfaces. Thus, it is necessary to remove and/or polish certain surfaces of semiconductor wafers during the fabrication of the ICs before carrying out the next process steps.

Chemical Mechanical Polishing or Planarization (CMP) is a process in which material is removed from a substrate surface, as for example, the surface of a semiconductor wafer, and the surface is polished (planarized) by coupling a physical process such as abrasion with a chemical process such as oxidation or chelation. In its most rudimentary form, CMP involves applying a slurry, i.e., a suspension of an abrasive and an active chemistry, to a polishing pad that buffs the surface of a semiconductor wafer to achieve the removal, planarization and polishing. It is not desirable for the removal or polishing to be comprised of purely physical or purely chemical action, but rather the synergistic combination of both in order to achieve a fast uniform removal. In the fabrication of ICs, the CMP slurry should also be able to preferentially remove films that comprise complex layers of metals and other materials so that highly planar surfaces can be produced for subsequent photolithography, patterning, etching and thin-film processing.

Nowadays, copper is increasingly used for metal interconnects in ICs. In the copper damascene or dual damascene process commonly used for the metallization of circuitry in the semiconductor fabrication, the layers that must be removed and planarized include copper layers having a thickness of about 1-1.5 µm and copper seed layers having a thickness of about 0.05-0.15 µm. These copper layers are separated from the low-k and ultra low-k dielectric material by a layer of barrier material, typically about 5 to 30 nm thick, which prevents diffusion of copper into the low-k or ultra low-k dielectric material. The key to obtaining good uniformity across the wafer surface after polishing is to use a CMP slurry that has the correct removal selectivities for each material.

Although CMP processes employing CMP slurries have been and still are extensively used for fabricating electrical devices, many problems are encountered therewith.

Thus, the usual CMP process involves dispensing the CMP slurry from a stationary overlying tube dropwise onto a polishing pad of a moving, e.g., rotating, table (platen), such as one which rotates about a stationary platen axis and against which the workpiece, e.g., a wafer substrate, which is usually carried by a retaining ring, makes frictional contact while the workpiece and ring move, e.g., rotate and oscillate, relative to the platen. The workpiece is normally positioned in a medial aperture of the retaining ring. Since the position of the workpiece relative to the platen varies during wafer movement, the slurry dispensing tube is always spaced a minimum clearance distance away from the workpiece.

Consequently, different portions of the wafer or other substrate necessarily encounter dispensed slurry droplets having different chemical constitution. This depends on the continuously varying distance between the relative position of movement, e.g., rotation and oscillation, of the wafer or other substrate and in particular of its leading and trailing edges during movement and the position of the centrifugally outwardly traveling slurry droplets dispensed onto the rotating platen from the stationary tube. As a result, the amount and chemical constitution of the slurry at the local polishing site of the wafer or other substrate workpiece is inherently non-uniform, leading to non-uniformity of the CMP operation.

Also, some CMP slurry on the polishing pad is pushed off the plate by the retaining ring and wafer or other substrate workpiece arrangement, which is normally pressed under mechanical pressure (downforce) against the polishing pad. This loss of CMP slurry constitutes a wastage which increases operating costs. By its continuous sliding contact relation with the polishing pad, the wafer or other substrate workpiece necessarily impedes the flow of the CMP slurry to the central area of the surface thereof being polished. This can cause poor center-to-edge uniformity, further detracting from the uniformity of the CMP operation.

Moreover, since the CMP slurry constitutes a physical suspension of solid abrasive particles in a liquid, its components must be premixed in a storage vessel or freshly mixed immediately prior to delivery onto the polishing pad to provide the abrasive particles in the desired uniform suspension therein. If the components are premixed, the storage lifetime of the CMP slurry is a limiting factor, especially due to the potential vulnerability of the CMP slurry to agglomeration of the abrasive particles with themselves and/or with other components of the CMP slurry. On the other hand, if the components are freshly mixed immediately prior to delivery on to the polishing pad, the system must include sophisticated pumps to meter the CMP slurry in a precisely controlled flow.

But also the polishing pads customarily used in the CMP process cause problems.

Thus, their surface is roughened during the polishing by the interaction with the abrasive particles and, therefore, starts to glaze due to the incorporation of, for example, wear debris from the abrasive particles and ultra low-k materials and residues formed from metal ions and corrosion inhibitor compounds such as benzotriazole (BTA). Thus, the copper ion concentration in the CMP slurry can exceed the maximum solubility of the copper-inhibitor complexes during CMP. Therefore, the copper-inhibitor complexes can precipitate from solution and can coagulate into a surface residue. All the grit and residues can then stick to the surface of the polishing pad and accumulate to eventually filling the grooves in the polishing pads and, therefore, can deleteriously reduce the polishing efficiency. This makes it necessary to condition the polishing pads with diamond grit. However, this constitutes an additional process step which furthermore increases the operating costs.

In order to overcome the drawbacks set out above, numerous abrasive pads have been proposed in the prior art.

Thus, the international patent application WO 97/11484 and the U.S. Pat. No. 5,692,950 and U.S. Pat. No. 6,121,143 disclose abrasive articles, e.g., polishing pads, which can be erodible and which have a three-dimensional textured abrasive surface that includes a plurality of abrasive particles and a binder in a predetermined pattern. The average particle size of the abrasive particles can range from about 0.001 to 15 μm, typically between 0.01 to 10 μm. Their surface can be modified with a coupling agent which provides an association bridge between the binder and the abrasive particles.

The U.S. Pat. No. 5,733,176 discloses an abrasive polishing pad having voids and optional abrasives such as silica, ceria or zirconia incorporated therein. The voids are located beneath the polishing surface and contain an endpoint indicator substance, i.e., a fluid, for producing a detectable signal as the abrading of the abrasive polishing pad against the wafer releases the endpoint indicator, thereby indicating a worn-out polishing pad.

The U.S. Pat. No. 5,342,419 discloses an abrasive composite containing abrasive particles in a binder and clay particles dispersed therein. The composite is adhered to a backing such as paper, cloth, polymeric foam or nonwoven backing. The clay particles allow the binder, and thus the composite, to erode controllably upon abrasion of a workpiece and expose fresh abrasive particles.

The U.S. Pat. No. 5,368,619 discloses abrasive articles made from slurries of a binder precursor, i.e., a polymerizable or curable resin, abrasive particles and sufficient modifying silica particles to reduce the slurry viscosity.

The U.S. Pat. No. 5,378,251 discloses abrasive articles formed of a backing on which an adhesive coating is bonded, the coating comprising a homogeneous mixture of abrasive particles, a binder and a grinding aid consisting of a halide salt and an organic halide such as polyvinyl chloride.

The U.S. Pat. No. 5,919,082 discloses an abrasive polishing pad having a first member with an abrasive first material, e.g., a polyurethane or phenyleneoxide material containing 15-1000 nm abrasive particles such as silica, ceria, alumina, tantalum oxide or manganese dioxide, that is structurally degraded during polishing.

The U.S. Pat. No. 5,972,792 discloses an abrasive polishing pad formed of abrasive particles dispersed in a suspension medium and fixedly attached to the suspension medium.

The American patent application US 2003/0054735 A1 and the U.S. Pat. No. 6,659,846 B2 disclose an abrasive polishing pad formed of a plurality of particles of abrasive material disposed in a matrix material. The abrasive particles may be stiff inorganic materials coated with a coupling agent and the matrix material may be a polymeric material such as a polyurethane. The abrasive particles may be unevenly distributed in the matrix in order to avoid the so-called edge effect.

The American patent application US 2002/0068456 A1 discloses an abrasive polishing pad formed of abrasive particles dispersed in a polymer matrix. The polymer matrix additionally contains organic or inorganic reactive agents that can react with the metal to be polished. Examples for such organic or inorganic reactive agents are organic or inorganic nitrites and nitrates, citric acid, citrates, oxalates, tartaric acid, tartrates, amines, iodine, iodates, carbonates, diamines, ethylenediaminetetraacetic acid, ammonium compounds, chlorates, perchlorates, salicylic acid, sulfosalicylic acids, organic peroxides or inorganic peroxides such as calcium peroxide.

The American patent application US 2003/0100244 A1 and the U.S. Pat. No. 6,685,540 B2 disclose the polishing pad comprising composite particles having a solid core encapsulated by a polymeric shell material. The solid core is selected from the group consisting of ceramic materials and diamond. The composite particles are preferably spherical in shape and about 1 μm to about 2 mm in diameter. The solid core is also preferably spherical and preferably about 0.5 μm to about 0.5 mm in diameter.

The U.S. Pat. No. 7,011,574 B2 discloses an abrasive polishing pad having a polishing layer of erodible binder material containing uniformly distributed therein both abrasive particles and a water soluble ionizable electrolyte substance such as a polyelectrolyte. During the polishing, the binder material incrementally erodes, and the abrasive particles and electrolyte substance are incrementally released into direct contact with the substrate.

Although these prior art abrasive polishing pads can ameliorate to some extent the problem of locally non-uniform abrading conditions, the even flow of the CMP slurry and, thus, of the reactive agents contained therein to the center of the workpiece is still impeded, which causes poor center-to-edge uniformity, further detracting from the uniformity of the CMP operation.

There have been attempts to resolve these problems by way of polishing pads being free of abrasive particles and containing functional groups chemically or adhesively bonded to the polymeric materials constituting the polishing pads.

Thus, the German patent application DE 103 22 468 B3 discloses a polyurethane for polishing pads, which polyurethane comprises functional groups containing electron donors as ligand atoms capable of chelating or complexing copper.

The international patent application WO 2007/021414 A1 and the American patent application US 2008/0034670 A1 disclose a polishing pad containing functional groups derived from polyamines, polyelectrolytes and/or amino acids.

The U.S. Pat. No. 6,383,065 B1 discloses a polishing pad containing a catalyst having multiple oxidation states such as soluble metal compounds, in particular, iron compounds. These catalysts are capable to decompose oxidizing agents, e.g., hydrogen peroxide, contained in the CMP slurry.

These prior art polishing pads are capable to ameliorate to some extent the problems caused by the uneven flow of the agents contained in the CMP slurries. However, the problem of locally non-uniform abrading conditions still remains.

OBJECTS OF THE INVENTION

It was the object of the present invention to provide novel abrasives articles, in particular novel abrasives polishing pads, useful for the chemical mechanical polishing or planarization (CMP) process in the fabrication of electrical devices, in particular, semiconductor integrated circuits (ICs); liquid crystal panels; organic electroluminescent panels; printed circuit boards; micro machines; DNA chips; micro plants and magnetic heads; preferably ICs with LSI (large-scale integration) or VLSI (very-large-scale integration); as well as optical devices, in particular, optical glasses such as photo-masks, lenses and prisms; inorganic electroconductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

The novel abrasives articles should no longer exhibit the drawbacks of the prior art abrasive article and should be particularly well-suited for the CMP in the fabrication of semiconductor ICs, especially ICs with LSI or VLSI.

The novel abrasives articles should exhibit a high material removal rate (MRR) while maintaining excellent planarization characteristics. Moreover, they should solve the problems associated with locally non-uniform chemical and physical conditions during the CMP of the workpiece substrates.

The novel abrasives articles, in particular the novel abrasives polishing pads, should be excellently suited for the CMP of patterned and unstructured metal surfaces, preferably of patterned metal surfaces, more preferably of metal patterns embedded in dielectric materials, in particular copper containing patterns. In particular, they should have an excellent polishing efficiency without causing dishing during the copper damascene process. They should not exhibit any undesired corrosive effects and ought not to effectuate defects, scratches and pitting in the materials, particularly the metals and the ultra-low-k dielectric materials of the topographies to be polished.

Moreover, it should be possible to manufacture the novel abrasives articles in a excellently reproducible and cost-effective manner.

The novel abrasives articles should allow for an excellently reproducible and cost-effective CMP process in the fabrication of electrical and optical devices.

SUMMARY OF INVENTION

Accordingly, the novel abrasives articles have been found containing solid abrasive particles (A) selected from the group consisting of inorganic particles, organic particles and inorganic-organic hybrid particles (a1) having an average primary particle size of from 1 to 500 nm as determined by laser light diffraction and having electron donor groups (a2) chemically bonded to their surface; the said solid abrasive particles (A) being distributed throughout or on top of or throughout and on top of a solid matrix (B).

Hereinafter, the novel abrasives articles are referred to as the "articles of the invention".

Moreover, the novel method for manufacturing abrasive articles has been found, the said method comprising the steps of (1) providing at least one kind of solid abrasive particles (A) selected from the group consisting of inorganic particles, organic particles and inorganic-organic hybrid particles (a1) having an average primary particle size of from 1 to 500 nm as determined by laser light diffraction and having electron donor groups (a2) chemically bonded to their surface; and
(2) distributing the solid abrasive particles (A) throughout or on top of or throughout and on top of a solid matrix (B).

Hereinafter, the novel method for manufacturing abrasive articles is referred to as the "manufacturing method of the invention".

Additionally, the novel method for processing substrates useful for fabricating electrical and optical devices has been found, the said method comprising the steps of (1) contacting the substrate surface at least once with at least one abrasive article of the invention and at least one liquid chemical mechanical polishing agent and
(2) chemically and mechanically polishing the substrate surface for a time sufficient to achieve planarization.

Hereinafter, the novel method for processing substrates useful for fabricating electrical and optical devices is referred to as the "CMP method of the invention".

ADVANTAGES OF THE INVENTION

In view of the prior art discussed above, it was surprising and could not be expected by the skilled artisan that the objects underlying the present invention could be solved by the articles of the invention, the manufacturing method of the invention and the CMP method of the invention.

It was particularly surprising that the articles of the invention were markedly useful for the chemical mechanical polishing or planarization (CMP) in the fabrication of electrical devices, in particular, semiconductor integrated circuits (ICs); liquid crystal panels; organic electroluminescent panels; printed circuit boards; micro machines; DNA chips; micro plants and magnetic heads; preferably ICs with LSI (large-scale integration) or VLSI (very-large-scale integration); as well as optical devices, in particular, optical glasses such as photo-masks, lenses and prisms; inorganic electroconductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

The articles of the invention no longer exhibited the drawbacks of the prior art abrasive articles and were particularly well-suited for the CMP in the fabrication of semiconductor ICs, especially ICs with LSI or VLSI.

The articles of the invention exhibited a particularly high material removal rate (MRR) while maintaining surprisingly excellent planarization characteristics. Moreover, they solved the problems associated with locally non-uniform chemical and physical conditions during the CMP of the substrate surfaces.

The articles of the invention were excellently suited for the CMP of patterned and unstructured metal surfaces, preferably of patterned metal surfaces, more preferably of metal patterns embedded in dielectric materials, in particular copper containing patterns. In particular, they had an excellent polishing efficiency without causing dishing during the copper damascene process. They did not exhibit any undesired corrosive effects and did not effectuate any defects, scratches and pitting in the materials, particularly the metals and the ultra-low-k dielectric materials of the topographies to be polished.

Moreover, it was possible to manufacture the articles of the invention in a excellently reproducible and cost-effective manner.

The articles of the invention allowed for an excellently reproducible and cost-effective CMP process in the fabrication of electrical and optical devices.

DETAILED DESCRIPTION OF THE INVENTION

In its broadest aspect, the present invention is directed to abrasive articles containing solid abrasive particles (A) which are distributed throughout or on top of or throughout and on top of a solid matrix (B).

This means, that the solid abrasive particles (A) can be located within the bulk of the solid matrix (B) or only at its surface. However, they also can be located within the bulk and at the surface of the solid matrix (B).

The solid abrasive particles (A) can be evenly or unevenly distributed. An even distribution means that the solid abrasive particles (A) have the same concentration at every location of the solid matrix (B).

An uneven distribution can be realized in various ways.

Thus, the concentration of the solid abrasive particles (A) can increase or decrease with the depth, i.e., with the distance from the surface of the solid matrix (B). The increase or decrease can happen linear or follow another mathematical function such as an e-function. Moreover, the increase or decrease can happen stepwise.

There can also be an uneven distribution of the solid abrasive particles (A) over the width of the solid matrix (B). Thus, the concentration of the solid abrasive particles (A) can be higher at the edge of the solid matrix (B) than in its center or vice versa. Also in this case, the variation of the concentration can happen continuously or stepwise.

The variation of the concentration with depth and width can also be combined. Thus, the concentration can decrease with the depth and increase with the width.

Which embodiment of distribution is chosen for a given article of the invention depends primarily on the requirements of the CMP process the article of the invention is used for. Thus, the skilled artisan will select an article of the invention having a concentration of solid abrasive particles (A) which is lower at its edge than at its center if he wants to avoid the so-called edge-effect. The edge-effect leads to a material removal rate (MRR) which is higher at the edges of the substrate to be polished than at its center. If the article of the invention is purposefully abraded or eroded during the CMP process, the skilled artisan will select an article of the invention, wherein the concentration of the solid abrasive particles (A) decreases with the depth so that he can achieve a lower MRR at the end of the CMP process, i.e., a soft-landing effect. Such and other distributions are described for example in the U.S. Pat. No. 6,659,846 B2, column 2, line 56, to column 4, line 65, in conjunction with the FIGS. 1 to 3.

The articles of the invention can have most different shapes and sizes. Therefore, they can be most advantageously adapted to the requirements of different CMP processes, CMP slurries and substrates to be polished. Preferably, the articles of the invention are pads, cloths, rolls or endless belts, preferably pads. The thickness of the articles of the invention can vary between 500 µm to 10 mm or more. The surface area can vary between several square centimeters to several square meters.

The solid abrasive particles (A) are selected from the group consisting of inorganic particles, organic particles and inorganic-organic hybrid particles, preferably inorganic particles (a1) carrying electron donor groups (a2) and having an average primary particle size of from 1 to 500 nm, preferably 2 to 400 nm, more preferably 4 to 300 nm, even more preferably 8 to 200 nm and, most preferably, 12 to 100 nm as determined by laser light diffraction.

The particle size distribution of the solid abrasive particles (A) itself can be monomodal or multimodal, in particular bimodal. In order to have an easily reproducible property profile and easily reproducible conditions during the CMP method of the invention, a monomodal particle size distribution is preferred.

The solid abrasive primary particles (A) may form aggregates and agglomerates, the average particle size of which should preferably not exceed 500 nm. However, the primary particles (A) are most preferably used.

Moreover, the solid abrasive particles (A) can have different shapes. For example, they can have the shape of cubes, cubes with chamfered edges, octahedrons, icosahedrons, nodules or spheres with or without protrusions or indentations. Preferably, they are spherical with no or only very few protrusions or indentations because this shape increases both, the resistance to the mechanical forces the particles are exposed to during the CMP process of the invention and the chemical stability to the the CMP agent or slurry used in the CMP method of the invention.

Moreover, they can be homogeneous materials or inhomogeneous materials such as composite materials or materials with core-shell structures. They can be hollow or compact. Or they can have a spongy structure with a high specific surface capable of absorbing metal atoms or cations. Preferably, they are compact and, more preferably, also essentially or completely homogeneous, because this increases both, the resistance of the solid abrasive particles (A) to the mechanical forces and their chemical stability.

Preferably, the inorganic particles (a1) are selected from the group consisting of alumina, germania, silica, ceria, titania, zirconia, zinc oxide, silicon nitride and silicon carbide. These inorganic particles (a1) are known, for example, from the international patent application WO 2005/014753 A1, page 12, lines 1 to 8 or from the U.S. Pat. No. 4,954,142, U.S. Pat. No. 5,958,288, U.S. Pat. No. 5,980,775, U.S. Pat. No. 6,015,506, U.S. Pat. No. 6,068,787, U.S. Pat. No. 6,083,419, and U.S. Pat. No. 6,136,711.

Preferably, the organic particles (a1) are selected from the group consisting of melamine, melamine derivatives, melamine-formaldehyde resins, dicyandiamide, as well as epoxy resins, polyurethanes, polyesters, polyamides, polycarbonates, polyolefins, polyvinylchloride, polystyrenes and polyacrylates and polymethacrylates including their respective copolymers, graft copolymers and blends. Such organic particles (a1) are known, for example, from the international patent applications WO 2005/014753 A1 and WO 2006/074248 A2, the European patent EP 1 077 240 B1, the European patent applications EP 0 919 602 A1 and EP 1 036 836 A1 or the US patent application US 2006/0243702 A1.

Preferably, the inorganic-organic hybrid particles (a1) are selected from the group consisting of inorganic particles (a1), more preferably, the inorganic particles (a1) described above, which are coated with at least one polymer selected from the group consisting of epoxy resins, melamine-formaldehyde resins, polyurethanes, polyesters, polyamides, polycarbonates, polyolefins, polyvinylchloride, polystyrenes and polyacrylates and polymethacrylates including their respective copolymers, graft copolymers and blends; as well as organic particles (a1), more preferably, the organic particles (a1) described above, which are coated with at least one of alumina, germania, silica, ceria, titania, zirconia, zinc oxide, silicon nitride and silicon carbide; and particles consisting of at least one inorganic particle (a1), more preferably, at least one of the inorganic particles (a1) described above, and at least one organic particle (a1), more preferably, at least one of the organic particles (a1) described above. Such inorganic-organic hybrid particles (a1) are known, for example, from the US patent application US 2006/0243702 A1.

The solid abrasive particles (A) contain electron donor groups (a2) which are chemically, i.e., covalently or ionically, preferably covalently, bonded to their surface.

Preferably, the electron donor groups (a2) are selected from the group consisting of primary, secondary and tertiary amino and phosphane groups, hydrazine groups, oxime groups, biuret groups, carbonyl groups, hydroxyl groups, thiol groups, sulfanyl groups, ether groups, thioether groups, carboxylic, sulfonic, phosphonic and phosphate ester groups as well as the anionic groups derived therefrom, and aminomethylene carboxylic acid and phosphonic acid groups as well as the anionic groups derived therefrom.

More preferably, the electron donor groups (a2) are selected from the group consisting of primary, secondary and tertiary amino groups, carbonyl groups, hydroxyl groups, ether groups, carboxylic, sulfonic, phosphonic and phosphate ester groups as well as the anionic groups derived therefrom, and aminomethylene carboxylic acid and phosphonic acid groups as well as the anionic groups derived therefrom.

A given solid abrasive particle (a1) can contain only one kind of an electron donor group (a2). However, at least two kinds of electron donor groups (a2) may be used as long as they do not deleteriously interact with each other. Examples for advantageous combinations of electron donor groups (a2) are enolic groups, crown ether groups, and primary and secondary amino groups.

Preferably, the electron donor groups (a2) cover most of the outer surface of the particles (a1). This means that more than 50%, more preferably more than 60%, even more preferably more than 75% and, most preferably, more than 90% of the outer surface carries electron donor groups (a2).

For compatibilisation of the particles with the matrix it could be advantageous to mix electron donor groups (a2) with non-donating groups selected from the group consisting of substituted and unsubstituted groups containing or consisting of at least one alkyl, cycloalkyl and aryl group and at least two of such groups being different from each other. This means that more than 50%, more preferably more than 60%, even more preferably more than 75% and, most preferably, more than 90% of the outer surface carries electron donor groups (a2) and non-donating groups.

The electron donor groups (a2) can be bonded directly to the surface of the particles (a1). More preferably, they are ionically or covalently, even more preferably covalently, bonded to the particles (a1) via multivalent linking groups (a3).

Preferably, the multivalent linking group (a3) is selected from the group consisting of organic moieties having to 2 to 20 carbon atoms, more preferably 2 to 16 carbon atoms and, most preferably, 2 to 10 carbon atoms.

More preferably, the organic moieties (a3) are selected from the group consisting of moieties containing or consisting of substituted and unsubstituted, preferably unsubstituted, branched and linear, aliphatic, olefinically unsaturated and acetylenically unsaturated groups as well alicyclic and aromatic groups. Most preferably aliphatic groups are used.

Suitable substituents may be selected from the group consisting of fluorine, chlorine and bromine atoms, nitrile groups, nitro groups, alkyloxy groups, phenoxy groups and ester groups.

Thus, the organic moiety (a3) can be an alkyl group, an alkylene group, an alkinyl group, an alicyclic group or an aromatic group.

The organic moiety (a3) can also contain two or more differing alkyl groups, alkylene groups, alkinyl groups, alicyclic groups or aromatic groups which are connected to each other by multifunctional groups (a31), preferably the multifunctional groups (a31) described below.

Additionally, the organic moiety (a3) can also contain at least two groups selected from different classes of groups, as for example, one alkyl group and one alicyclic group, or two alkyl groups which are linked by an aromatic group. The groups selected for the organic moiety (a3) can be connected to each other by carbon-carbon bonds and/or by multifunctional groups (a31), preferably the multifunctional groups (a31) described below.

More preferably, the aliphatic groups or alkyl groups are derived from aliphatic hydrocarbons selected from the group consisting of substituted and unsubstituted ethane propane, iso-propane butane, isobutane, pentane, isopentane, neopentane, hexane, heptane, octane, isooctane, 2-methyl-heptane, 2-methyl-hexane, nonane, decane, undecane, dodecane, tridecane, tetradecane, pentadecane and hexadecane, preferably ethane, propane, butane, isobutane, hexane, octane and dodecane, most preferably ethane and propane.

More preferably, the olefinically unsaturated groups or alkenyl groups are derived from olefins selected from the group consisting of substituted and unsubstituted ethylene, propylene, but-1-ene, but-2-ene, pent-1-ene, pent-2-ene, hex-1-ene, hex-2-ene, hept-1-ene, oct-1-ene, oct-2-ene, oct-3-ene, non-1-ene, dec-1-ene, dodec-1-ene, undec-1-ene, dodec-1-ene, tridec-1-, tetradec-1-ene, pentadec-1-ene, and hexadec-1-, -2-, -3-, -4-, -5-, -6-, -7- and -8-ene, in particular ethylene.

More preferably, the acetylenically unsaturated groups or alkinyl groups are derived from acetylenically unsaturated hydrocarbons selected from the group consisting of substituted and unsubstituted acetylene, propyne, but-1-yne, but-2-yne, pent-1-yne, pent-2-yne, hex-1-yne, hex-2-yne, hept-1-yne and oct-1-, -2-, -3- and -4-yne, in particular acetylene and propyne.

More preferably, the alicyclic groups are derived from alicyclic compounds selected from the group consisting of substituted and unsubstituted cyclopropane, cyclobutane, cyclopentane, cyclohexane, cyclohexene, norbonane and adamantane, in particular cyclopentane and cyclohexane.

More preferably, the aromatic groups are derived from aromatic compounds selected from the group consisting of substituted and unsubstituted benzene, biphenyl, naphthalene, anthracene and phenanthrene, in particular benzene.

Most particularly preferably, ethylene or propylene groups (a3) are used.

As already mentioned above, the multivalent linking groups (a3) each can contain at least one, preferably one, multifunctional group (a31). These multifunctional groups (a31) may connect the alkyl groups, alkylene groups, alkinyl group, alicyclic groups and/or aromatic groups of a multivalent linking group (a3) with each other. Even more preferably, one multifunctional group (a31) or one of the multifunctional groups (31) connects the multivalent linking group (a3) with the surface of the particles (a1).

Preferably, the multifunctional groups (a31) are selected from the group consisting of:
—O—, —C(O)—, —C(S)—, —C(O)—O—, —O—C(O)—O—, —O—C(S)—O—;
—(—O—)$_4$Si, —(—O—)$_3$Si—, —(—O—)$_2$Si<,
—O—SiΞ, —(—O—)$_2$Si(—R)—, —O—Si(—R)$_2$—;

—NR—, =N—, —N=N—, —NR—C(O)—, —NR—NR—C(O)—, —NR—NR—C(S)—, —O—C(O)—NR—, —O—C(S)—NR—, —NR—C(O)—NR—, —NR—C(S)—NR—;

—(—O—)$_3$P(O), —(—O—)$_3$P(S), —(O)$_2$P(O)—, —(—O—)$_2$P(S)—, —(—NR—)$_3$P(O), —(—NR—)$_3$P(S), —(—NR—)$_2$P(O)—, —(—NR—)$_2$P(S)—;

—S—, —S(O)—, —S(O)$_2$—, —O—S(O)$_2$—, and —NR—S(O)$_2$—;

wherein the residue R is a hydrogen atom or a non-reactive, monovalent, substituted or unsubstituted moiety having one carbon atom or 2 to 20 carbon atoms, with the proviso that R bonded to silicium is not a hydrogen atom.

More preferably, the multivalent linking groups (a3) are selected from the group consisting of: —(—O—)$_4$Si, —(—O—)$_3$Si—, —(—O—)$_2$Si<, —O—SiΞ, —(—O—)$_2$Si(—R)—, and —O—Si(—R)$_2$—, wherein the silicon atom is bonded to the surface of the particle (a1) via at least one oxygen atom. Most preferably, the the multivalent linking groups (a3) are —(—O—)$_3$Si— groups, wherein the silicon atom is bonded to the surface of the particle (a1) via the three oxygen atoms.

More preferably, the moieties R having one carbon atom or 2 to 20 carbon atoms are chosen from the group consisting of methyl and the containing or consisting of substituted and unsubstituted, branched and linear, aliphatic, olefinically unsaturated and acetylenically unsaturated groups as well the alicyclic and aromatic groups described above.

Examples of most advantageous moieties consisting of an electron donor group (a2) and a bivalent linking group (a3) having a multivalent group (a31) are —(—O—)$_3$Si— groups, wherein the silicon atom is directly connected to the following moieties:

3-[2-(2-aminoethylamino)ethylamino]-propyl,
N-(2-aminoethyl)-3-aminopropyl,
3-aminopropyl,
3-(2-imidazoline-1-yl)-propyl,
3-[bis(2-hydroxyethyl)amino]propyl,
3-(sulfonic acid)-propyl,
2-(diethylphosphato)-ethyl,
3-(methylphosphonate monosodium salt)-propyl,
3-(succinic anhydride)-propyl,
3-mercapto-propyl
3-ureidopropyl,
N-benzyl-N-(2-aminoethyl)-3-aminopropyl,
N-(n-butyl)-3-aminopropyl,
2-[metoxy(polyethyleneoxy)-propyl
3-glycidyloxypropyl,
3-(N,N-dimethylamino)-propyl,
3-(N,N-diethylamino)-propyl, or
3-(N-(triacetic acid trisodium salt)ethylenediamine)-propyl.

The articles of the invention contain the solid abrasive particles (A) in broadly varying amounts. Therefore, the articles of the invention can be most advantageously adapted to the requirements of different CMP processes, different CMP slurries and different substrates. Preferably, the articles of the invention contain 1 to 80% by weight, more preferably 2 to 70% by weight, and, most preferably, 5 to 50% by weight of the solid abrasive particles (A), each weight percentage being based on the complete weight of an article of the invention.

The solid matrix (B) of an article of the invention contains or consists of at least one three-dimensional structure which contains the solid abrasive particles (A).

A large variety of three-dimensional structures can be used for manufacturing the articles of the invention. Therefore, the articles of the invention can be most advantageously adapted to the requirements of different CMP processes, different CMP slurries and different substrates by selecting the most advantageous three-dimensional structure.

Preferably, the three-dimensional structure is selected from the group consisting of woven and nonwoven cloths and textiles, foams and compact materials.

The material composition of the three-dimensional structures can vary extremely broadly. Thus, the three-dimensional structure can contain or consist of inorganic, organic and inorganic-organic hybrid materials such as conventional thermoplastic polymers suitable for extrusion and molding processes or materials derived from conventional curable, crosslinkable polymer precursors, curable ceramer precursors or materials suitable for dry sintering/powder metallurgy processes. Such materials are described, for example, in the international patent application WO 97/11484, page 37, line 1 to page 44, line 15 and page 49, line 1 to page 54, line 25;

the U.S. Pat. No. 6,659,846 B2, column 4, lines 58 to 65;

the German patent DE 103 22 468 B3, page 3, paragraph [0014] to page 5, paragraph [0024]; and the U.S. Pat. No. 7,011,574 B2, column 18, line 10 to column 19, line 43.

The polishing surface of the three-dimensional structures can contain patterns consisting of protruding and/or recessed areas. These areas can form spiral grooves or concentric circular grooves and/or lattice-form grooves as described, for example, in the U.S. Pat. No. 6,749,714 B1.

The solid matrix (B) or the three-dimensional structure can be bonded to a backing material (D) such as a polymeric film, a paper, a cloth, a metallic film, a vulcanized fiber or non-woven substrate as described, for example, in the U.S. Pat. No. 7,011,574 B2, column 19, lines 43 to 59. The bonding can be releasable or permanent.

In addition to this, the solid matrix (B) can contain at least one functional additive (E). Preferably, the functional additive (E) is selected from the group of organic or inorganic reactive agents, in particular organic or inorganic nitrites and nitrates, citric acid, citrates, oxalates, tartaric acid, tartrates, amines, iodine, iodates, carbonates, diamines, ethylenediaminetetraacetic acid, ammonium compounds, chlorates, perchlorates, salicylic acid, sulfosalicylic acids, organic peroxides or inorganic peroxides such as calcium peroxide as described American patent application US 2002/0068456 A1, page 4 paragraphs [0032] and [0036];

catalysts having multiple oxidation states as described, for example in the U.S. Pat. No. 6,383,065 B1, column 3, line 13 to column 4, line 8, in particular ferric nitrate;

endpoint indicator substances, as described, for example, in the U.S. Pat. No. 5,733,176;

fluorochemical agents as described, for example, in the U.S. Pat. No. 6,121,143, column 4, line 62 to column 5, line 67;

polyelectrolytes as described, for example, in the U.S. Pat. No. 7,011,574 B2, column 16, line 59 to column 17, line 54;

conventional abrasive particles as described hereinbefore or in the international patent application WO 97/11484, page 29, line 19 to page 34, line 15;

filler particles as described, for example, in the international patent application WO 97/11484, page 34, line 17 to page 36, line 30; and clay particles as described, for example, in the U.S. Pat. No. 5,342,419.

The articles of the invention may be prepared in any suitable conventional manner known from the prior art. Preferably, the articles of the invention are manufactured in accordance with the manufacturing method of the invention.

In the first step of the method of the invention, at least one kind, preferably one kind of solid abrasive particles (A) selected from the group consisting of inorganic particles, organic particles and inorganic-organic hybrid particles (a1)) having an average primary particle size of from 1 to 500 nm as determined by laser light diffraction and having electron donor groups (a2) chemically bonded to their surface; are provided. Most preferably, at least one kind, preferably one kind of the solid abrasive particles (A) described hereinbefore is provided.

To this end, at least one kind, preferably one kind, of particles (a1a) selected from the group of inorganic particles, organic particles and inorganic-organic hybrid particles having an average primary particle size of from 1 to 500 nm as determined by laser light diffraction and containing at their surface reactive functional groups (a4) are reacted with a suitable modifier (C) containing at least one electron donor group (a2) as described hereinbefore.

Preferably, the inorganic particles (a1a) are selected from the group consisting of alumina, germania, silica, ceria, titania, zirconia, zinc oxide, silicon nitride and silicon carbide. These inorganic particles (a1)) are known, for example, from the international patent application WO 2005/014753 A1, page 12, lines 1 to 8 or from the U.S. Pat. No. 4,954,142, U.S. Pat. No. 5,958,288, U.S. Pat. No. 5,980,775, U.S. Pat. No. 6,015,506, U.S. Pat. No. 6,068,787, U.S. Pat. No. 6,083,419, and U.S. Pat. No. 6,136,711.

Preferably, the organic particles (a1a) are selected from the group consisting of melamine, melamine derivatives, melamine-formaldehyde resins, dicyandiamide, as well as epoxy resins, polyurethanes, polyesters, polyamides, polycarbonates, polyolefins, polyvinylchloride, polystyrenes and polyacrylates and polymethacrylates including their respective copolymers, graft copolymers and blends. Such organic particles (a1a) are known, for example, from the international patent applications WO 2005/014753 A1 and WO 2006/074248 A2, the European patent EP 1 077 240 B1, the European patent applications EP 0 919 602 A1 and EP 1 036 836 A1 or the US patent application US 2006/0243702 A1.

Preferably, the inorganic-organic hybrid particles (a1a) are selected from the group consisting of inorganic particles (a1a), more preferably, the inorganic particles (a1a) described above, which are coated with at least one polymer selected from the group consisting of epoxy resins, melamine-formaldehyde resins, polyurethanes, polyesters, polyamides, polycarbonates, polyolefins, polyvinylchloride, polystyrenes and polyacrylates and polymethacrylates including their respective copolymers, graft copolymers and blends; as well as organic particles (a1a), more preferably, the organic particles (a1a) described above, which are coated with at least one of alumina, germania, silica, ceria, titania, zirconia, zinc oxide, silicon nitride and silicon carbide; and particles consisting of at least one inorganic particle (a1a), more preferably, at least one of the inorganic particles (a1a) described above, and at least one organic particle (a1a), more preferably, at least one of the organic particles (a1a) described above. Such inorganic-organic hybrid particles (a1a) are known, for example, from the US patent application US 2006/0243702 A1.

The particles (a1a) contain at their surface at least one kind, preferably one kind, of reactive functional groups (a4) which are capable of reacting with the complementary reactive functional groups (a5) of the modifier (C).

A large variety of different reactive functional groups (a4) can be selected, the major criteria being a high stability during handling and storing of the particles (a1a) and a high specific reactivity towards complementary reactive functional groups (a5) of the modifier (C) with virtually no side reactions occurring with the electron donor groups (a2). Most preferably the reactive functional groups (a4) are selected from hydroxyl groups and amino groups, in particular hydroxyl groups.

Likewise, a large variety of different modifiers (C) containing the complementary reactive functional groups (a5) can be selected, the major criteria being a high stability during handling and storing of the modifiers (C) and a high specific reactivity of their complementary reactive functional groups (a5) towards the reactive functional groups (a4) with virtually no side reactions of the electron donor groups (a2) occurring with the reactive functional groups (a4).

Preferably, the complementary reactive functional groups (a5) are selected from the group consisting of siloxane groups containing at least one hydrolyzable moiety.

More preferably, modifier (C) is of the general formula I:

(X-)$_m$(a3)(-Y)$_n$   (I), wherein the indices and the variables have the following meaning:
m integer from 1 to 3, preferably 3;
n integer from 1 to 20, preferably 1 to 4;
X moiety containing at least one complementary reactive functional group (a5) capable of reacting with a functional group (a4) on the particle (a1a);
a3 multivalent linking group as defined above; and
Y moiety containing or consisting of at least one electron donor group (a2) as described hereinbefore.

More preferably, the moiety X has the general formula II:

—Si(—R)$_p$(-a5)$_{3-p}$   (II);

wherein the variable R has the above-defined meaning except hydrogen atom and the variable a5 and the index have the following meaning:
p 0, 1 or 2, preferably 0;
a5 complementary reactive functional atom selected from the group consisting of hydrogen, fluorine, chlorine, bromine and iodine; or complementary reactive functional group having the general formula III:

—Z—R   (III), wherein the variable R has the above-defined meaning and the variable Z is a bifunctional linking group selected from the group consisting of —O—, —S—, —C(O)—, —C(S)—, —O—C(O)—, —S—C(O)—, —O—C(S)—, —NH— and —NR—, wherein the variable R has the above-defined meaning, except hydrogen atom.

Most preferably, the moiety X of the general formula II is selected from the group consisting of trihydroxysilyl, trimethoxysilyl and triethoxysilyl.

Most preferably, the moiety Y consists of an electron donor group (a2).

Most particularly preferably, the modifier (C) is selected from the group consisting of:
3-(2-(2-aminoethylamino)ethylamino)-propyltrimethoxysilane (AEPTS),
3-(2-(2-aminoethylamino)ethylamino)-propyltriethoxysilane,
N-(2-aminoethyl)-3-aminopropyltrimethoxysilane,
N-(2-aminoethyl)-3-aminopropyltriethoxysilane,
3-aminopropyltrimethoxysilane,
3-aminopropyltriethoxysilane,
3-(2-imidazoline-1-yl)-propyltriethoxysilane (IPTS),
3-(2-imidazoline-1-yl)-propyltrimethoxysilane,
bis(2-hydroxyethyl)-3-aminopropyltriethoxysilane (BHAP), bis(2-hydroxyethyl)-3-aminopropyltrimethoxysilane,
3-(trihydroxysilyl)-1-propane sulfonic acid (35% in water) (TSPS),
diethylphosphatoethyl triethoxysilane (DPEOS),
diethylphosphatoethyl trimethoxysilane (DPEOS),
3-(trihydroxysilyl)propyl methylphosphonate monosodium salt (42% in water) (TSMP),
3-(triethoxysilyl)propyl succinic anhydride (TPSA),
3-(trimethoxysilyl)propyl succinic anhydride
3-mercapto-propyltrimethoxysilane,
3-mercapto-propyltriethoxysilane,
3-ureidopropyltrimethoxysilane,
3-ureidopropyltriethoxysilane,
N-benzyl-N-(2-aminoethyl)-3-aminopropyltrimethoxysilane,
N-benzyl-N-(2-aminoethyl)-3-am inopropyltriethoxysilane,
N-(n-butyl)-3-aminopropyltrimethxysilane,
N-(n-butyl)-3-aminopropyltriethxysilane,
2-[metoxy(polyethyleneoxy)-propyltrimethoxysilane,
2-[metoxy(polyethyleneoxy)-propyltriethoxysilane,
3-glycidyloxypropyltrimethoxysilane,
3-glycidyloxypropyltriethoxysilane,
(N,N-dimethylaminopropyl)trimethoxysilane (DAPMS), and
(N,N-dimethylaminopropyl)triethoxysilane,
(N,N-diethylaminopropyl)trimethoxysilane,
(N,N-diethylaminopropyl)triethoxysilane,
N-(triethoxysilylpropyl)ethylenediamine triacetic acid trisodium salt (45% in water),
N-(trimethoxysilylpropyl)ethylenediamine triacetic acid trisodium salt (45% in water).

The reaction of the particles (a1a) with the modifiers (C) can be carried out by suspending the particles (a1a) a) in conventional reaction vessels containing stirring and heating or cooling equipment in aqueous or organic media and adding at least one modifier (C) in the desired amounts.

The aqueous media can contain water soluble organic solvents such as ketones such as acetone and/or alcohols such as isopropanol.

The organic media can be conventional polar and/or nonpolar organic solvents. However, also precursors useful for the preparation of the solid matrix (B) can be used, as for example, polyols useful for preparing polyurethanes.

The molar ratio of particles (a1a) to modifiers (C) can vary very broadly and, therefore, can be easily adapted to the particular requirements of a desired combination of (a1a) and (C). In particular, the molar ratio depends on the number of reactive functional groups (a4) at the surface of the particles (a1a) a) and the number of complementary reactive functional groups (a5) of the modifier (C). Therefore, the skilled artisan can easily determine the appropriate ratio for any desired combination of reactants.

The solid abrasive particles (A) thus obtained are distributed throughout or on top of or throughout and on top of the solid matrix (B) in the second step of the manufacturing method of the invention.

To this end, the suspension of the solid abrasive particles (A) in a liquid medium or the dry solid abrasive particles (A) can be mixed with the curable precursor materials for the matrix (B) using customary and standard mixing processes and mixing apparatuses such as agitated vessels, in-line dissolvers, high shear impellers, ultrasonic mixers, homogenizer nozzles or counterflow mixers. The resulting suspensions can be filtered through filters of the appropriate mesh aperture, in order to remove undesired coarse-grained particles such as the agglomerates or aggregates of the solid, finely dispersed abrasive particles (A). Thereafter, the curable suspension is cross-linked by heat and/or electromagnetic or corpuscular radiation such as near infrared, visible or ultraviolet light or electron beams. In this process step, the curable suspension is preferably cross-linked as a planar layer, preferably on top of a releasable backing which can contain patterns which are then transferred to the surface of the cross-linked suspension.

The dry solid abrasive particles (A) can also be mixed as a finely divided particular material with materials suitable for dry sintering/powder metallurgy processes, where after the mixture is dry-sintered. This way, the distribution of the solid abrasive particles (A) can be particularly well controlled, and concentration gradients can be generated in a controlled and reproducible manner. In this process step, the sinterable mixture is preferably sintered as a planar layer, preferably on top of a heat resistant releasable backing, e.g., a metal foil, which can contain patterns which are then transferred to the surface of the sintered layer.

Moreover, the suspensions of the solid abrasive particles (A) in a liquid medium, the dry solid abrasive particles (A) or a concentrated blend of the solid abrasive particles (A) in a conventional thermoplastic can be mixed with another thermoplastic polymer by extrusion or by kneading. The resulting melt can then be molded or calanderd in order to obtain the desired three-dimensional solid shape. In this process step, the surface of the three-dimensional solid shape can be embossed with patterns.

It is also possible to soak woven or nonwoven cloths and textiles with the suspensions of the solid abrasive particles (A) in a liquid medium followed by removing the liquid medium.

The resulting articles of the invention can be used for various purposes. Most preferably, they are used for processing substrates useful for electrical and optical devices in accordance with the CMP method of the invention.

In the first process step of the CMP method of the invention, the surface of the substrate to be polished is contacted with at least one, preferably one abrasive article of the invention, most preferably an abrasive article of the invention prepared in accordance with the manufacturing method of the invention, and with at least one, preferably one liquid CMP agent or a slurry.

In the second process step, the surface of the substrate is chemically and mechanically polished for a time sufficient to achieve planarization. The CMP agent or the CMP slurry can be fed continuously or dropwise to the surface to be polished and/or in the article of the invention during this process step.

It is one of the major advantages of the CMP method of the invention that the CMP agent or slurry no longer needs to contain solid abrasive particles which simplifies the preparation, storage and handling of the CMP agent or slurry. Moreover the risk of crating defects, scratches and pits in the materials of the topographies to be polished, as for example, metals and ultra-low-k dielectric materials, is a significantly reduced.

The main purpose of the CMP method of the invention however is the CMP of substrates useful for fabricating electrical devices, in particular, semiconductor integrated circuits (ICs); liquid crystal panels; organic electroluminescent panels; printed circuit boards; micro machines; DNA chips, micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

The CMP method of the invention is particularly well-suited for the processing of substrates useful for fabricating ICs with LSI or VLSI, in particular in the back end of the line processing (BEOL).

The CMP method of the invention is most particularly well-suited for the CMP semiconductor wafers in the fabrication of ICs with LSI or VLSI, in particular by the copper damascene or dual damascene process.

However, due to the most advantageous properties of the articles of the invention, the CMP method of the invention is particularly well-suited for the CMP of all kinds of metals, including their alloys, as well as semiconductors such as silicon, nickel phosphide or gallium arsenide.

Preferably, the metal has a standard reduction potential $E^0 > -0.1$ V, preferably $>0$ V, most preferably $>0.1$ V and in particular $>0.2$ V for the half-reaction $M \leftrightarrow M^{n+} + n\,e^-$, wherein n=integer of from 1 to 4 and $e^-$=electron.

Examples for such standard reduction potentials $E^0 > -0.1$ are listed in the CRC Handbook of Chemistry and Physics, 79th edition, 1998-1999, CRC Press LLC, Electrochemical Series, 8-21 to 8-31.

Preferably, the metal is selected from the group consisting of Ag, Au, Bi, Cu, Ge, Ir, Os, Pd, Pt, Re, Rh, Ru, Tl and W, most preferably Ag, Au, Cu, Ir, Os, Pd, Pt, Re, Rh, Ru and W. In particular, the metal is copper.

As is known in the art, typical equipment for the CMP consists of a rotating platen which is covered with a polishing pad. In the case of the CMP method of the invention, the conventional polishing pads are substituted by the articles of the invention.

The wafer is mounted on a carrier or chuck with its upper side down facing the article of the invention. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This article of the invention can operate as a cushion for the wafer.

Below the carrier, the larger diameter platen is also generally horizontally positioned and presents a surface parallel to that of the wafer to be polished. Its article of the invention contacts the wafer surface during the planarization process. During the CMP process of the invention, the CMP agent or slurry is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

After the CMP step, the surface of the semiconductor wafer can be contacted with a liquid cleaning composition for a time and a temperature sufficient to clean the unwanted contaminants and residues from the substrate surface. Optionally, the substrate can be rinsed to remove the liquid cleaning composition and the contaminants and residues and dried to remove any excess solvents or rinsing agents.

Preferably, a bath or a spray application is used to expose the substrate to the liquid cleaning composition. Bath or spray-cleaning times are generally one minute to 30 minutes, preferably 5 minutes to 20 minutes. Bath or spray-cleaning temperatures are generally 10° C. to 90° C., preferably 20° C. to 50° C.

If required, the rinsing times are generally 10 seconds to 5 minutes at room temperature, preferably 30 seconds to 2 minutes at room temperature. Preferably deionized water is used to rinse the substrates.

If required, the drying of the substrates can be accomplished by using any combination of air-evaporation, heat, spinning or pressurized gas. The preferred drying technique is spinning under a filtered inert gas flow, such as nitrogen, for a period of time until the substrate is dry.

EXAMPLES

Examples 1 to 10

The Preparation of Aqueous Suspensions of the Solid Abrasive Particles (A1) to (A10)
General Procedure:

Aqueous suspensions, each containing 30% by weight of silica nanoparticles having an average primary particle size of 12 nm as determined by laser light scattering, a BET surface area of 227 m²/g and a pH of 10 (NexSil™ 12 of Nyacol Nano Technologies, Inc.) and such aqueous suspensions having a pH of 2 or 3 after treatment with an ion exchange resin were diluted with water and were reacted with various modifiers (C). The modifiers (C) and the amounts of materials used are listed in the Table 1.

TABLE 1

Reaction Conditions for the Preparation of the Aqueous Suspensions of the Solid Abrasive Particles (A1) to (A10)

| Example No. | Particles (A) | NexSil 12 in g/ H₂O in ml/pH | Modifier (C)/g | Suspension |
|---|---|---|---|---|
| 1 | (A1) | 250/250/10 | 3-(2-(2-aminoethylamino)ethylamino)-propyltrimethoxysilane (AEPTS)/19.5 | opalescent |
| 2 | (A1) | 250/250/10 | 3-(2-imidazoline-1-yl)-propyltriethoxysilane (IPTS)/26 | opalescent |
| 3 | (A1) | 250/250/10 | bis(2-hydroxyethyl)-3-aminopropyltriethoxysilane (BHAP)/48 | opalescent |

TABLE 1-continued

Reaction Conditions for the Preparation of the Aqueous Suspensions of the Solid Abrasive Particles (A1) to (A10)

| Example No. | Particles (A) | NexSil 12 in g/ H₂O in ml/pH | Modifier (C)/g | Suspension |
|---|---|---|---|---|
| 4 | (A1) | 250/250/10 | 3-(trihydroxysilyl)-1-propane sulfonic acid (35% in water) (TSPS)/54 | opalescent |
| 5 | (A1) | 250/250/10 | diethylphosphatoethyl triethoxysilane (DPEOS)/31 | turbid |
| 6 | (A1) | 250/250/10 | 3-(trihydroxysilyl)propyl methylphosphonate monosodium salt (42% in water) (TSMP)/52 | opalescent |
| 7 | (A1) | 250/250/10 | 3-(triethoxysilyl)propyl succinic anhydride (TPSA)/29 | opalescent |
| 8 | (A1) | 100/100/2 | N,N-dimethylaminopropyl)trimethoxysilane (DAPMS)/7.8 | opalescent |
| 9 | (A1) | 250/250/3 | 3-(trihydroxysilyl)-1-propane sulfonic acid (35% in water) (TSPS)/54 | opalescent |
| 10 | (A1) | 250/250/3 | N-(trimethoxysilylpropyl)ethylenediamine triacetic acid trisodium salt (45% in water)(TMETT)/97 | opalescent |

The suspensions of the solid abrasive particles (A1) to (A10) were excellently suited for the preparation of CMP agents.

Examples 11 to 20 and Comparative Experiments C1 and C2

The Preparation of CMP Agents Containing the Solid Abrasive Particles (A1) to (A10) of the Examples 1 to 10 (Examples 11 to 20) and CMP Agents Containing No Solid Abrasive Particles (Comparative Experiment C1) and Unmodified Solid Abrasive Particles (Comparative Experiment C2) and Their Static Etch Rates SERs and Material Removal Rates MRRs
General Procedure:

For the examples 11 to 20, 0.2% by weight of glycine (the weight percentages being based on the complete weight of the resulting CMP slurry) was added to each of the suspensions containing 1% by weight of one of the solid abrasive particles (A1) to (A10) of the examples 1 to 10. Systematic adjustment of pH to 5.0 was accomplished by adding potassium hydroxide or nitric acid. Thereafter, 1% by weight of hydrogen peroxide was added prior to the comparative experiments. The suspensions of the examples 1 to 10 were used for preparing the CMP agents of the examples 11 to 20 in the following way:
Example 1-example 11,
example 2-example 12,
example 3-example 13,
example 4-example 14,
example 5-example 15,
example 6-example 16,
example 7-example 17,
example 8-example 18,
example 9-example 19, and
example 10-example 20.

An aqueous solution containing 1% by weight of hydrogen peroxide and 0.2% by weight of glycine (the weight percentages being based on the complete weight of the aqueous solution) was used for the comparative experiment C1.

For the comparative experiment C2, 1% by weight of hydrogen peroxide and 0.2% by weight of glycine (the weight percentages being based on the complete weight of the resulting CMP agent) were added to the unmodified NexSil™ 12 suspension.

The SERs of the CMP agents of the examples 11 to 20 and of the CMP agents of the comparative experiments C1 and C2 were determined as follows:

Copper discs were initially conditioned, washed, dried and then weighed before each experiment. For the examples 11 to 20 and the comparative experiments C1 and C2, the copper discs were conditioned by polishing them for 30 seconds with the slurry used in the respective example or comparative experiment. The copper discs were then held by a pair of Teflon covered tongs to reduce contamination and were then directly immersed in the stirred CMP agents of the examples 11 to 20 and the comparative experiments C1 and C2 at 25° C. and 50° C. The time of immersion was 5 minutes in each case. After the etching, the copper discs were cleaned with deionized water followed by an isopropyl alcohol rinse. Thereafter, the copper discs were dried with a steady stream of pressurized air, and the SER was calculated on the net weight-loss and the surface area of the disc using the following calculation:

$$SER = \text{Weight-loss}/[\text{Density} \times (\text{Circumferential Area} + 2 \times \text{Area of Cross-section}) \times \text{Time}],$$

wherein
Weight-loss=loss of weight in copper disc after dissolution;
Density=density of copper;
Area of Cross-section=cross-section area of the disc;
Circumferential Area=circumferential area of the disc; and
Time=dissolution time.

The MRRs of the CMP agents of the examples 11 to 20 and of the CMP agents of the comparative experiments C1 and C2 were determined as follows:

Again, the copper discs were conditioned (as explained before), washed, dried and then weighed before each experiment. Thereafter, they were attached to a stainless steel carrier and then mounted on a single-side polishing machine (CMP benchtop machine of CETR, Center for Tribology, Inc., Campbell, Calif.). A polyurethane IC 1400 polishing pad was used for the experiments. The copper discs were polished for 1 min under a pressure of 17.24 kPa (2.5 psi) by supplying each of the CMP agents at a rate of 60 ml/min on the pad at room temperature. The copper discs had a rotational speed of 115 rpm and the pad had a rotational speed speed of 112 rpm. The pad was conditioned with diamond grit conditioner to remove the products of the chemical reactions and to make the pad ready for the next run. After polishing, the discs were cleaned with a deionized water rinse followed by an isopropyl alcohol rinse. Thereafter, the discs were dried with a steady stream of pressurized air, and the MRR was calculated based on the net weight-loss in the polished surface area according to the calculation:

MRR=Weight-loss/(Density×Area of Cross-section× Time);

wherein
Weight-loss=loss of weight in copper disc after polish;
Density=density of copper;
Area of Cross-section=cross-section area of the disc; and
Time=polishing time.

The results of the experiments are summarized in the Table 2.

TABLE 2

The SERs and MRRs of the CMP Agents of the Examples 11 to 20 and of the CMP Agents of the Comparative Experiments C1 and C2

| Example No. Comparative Experiment No. | SER/nm/min 25° C. | SER/nm/min 50° C. | MRR//nm/min |
|---|---|---|---|
| 11 | 215 | 107 | 470 |
| 12 | 43 | 66 | 298 |
| 13 | 63 | 78 | 420 |
| 14 | 73 | 93 | 165 |
| 15 | 41 | 51 | 480 |
| 16 | 54 | 81 | 154 |
| 17 | 5 | 59 | 48.5 |
| 18 | 48 | 37 | 324 |
| 19 | 77 | 101 | 114 |
| 20 | 100 | 148 | 513 |
| C1 | 47 | 75 | — |
| C2 | 66 | 116 | 365 |

As can be gleaned from the Table 2, the applicational properties of the CMP agents could be varied most elegantly by way of different modifications of the solid abrasive particles (A). Thus, the CMP agent of the example 17 lead to a significant inhibition of the copper surface, whereas, for example, the CMP agents of the examples 11 or 20 increased the SER and the MRR. Therefore, the various solid abrasive particles (A) were excellently suited to manufacture abrasive articles, in particular abrasive pads, having different applicational properties adapted to the requirements of different CMP processes.

Examples 21 to 30

The Manufacture of Polyurethane Polishing Pads Containing the Solid Abrasive Particles (A1) to (A10) of the Examples 1 to 10

The suspensions of the examples 1 to 10 were used for preparing the polyurethane polishing pads of the examples 21 to 30 in the following way:
Example 1-example 21,
example 2-example 22,
example 3-example 23,
example 4-example 24,
example 5-example 25,
example 6-example 26,
example 7-example 27,
example 8-example 28,
example 9-example 29, and
example 10-example 30.

General Procedure:

The ten suspensions were prepared in accordance with the examples 1 to 10 and freeze-dried. The resulting finely divided solid abrasive particles (A1) to (A10) were each suspended in 23.2 parts by weight of the polyol 1 of the example 1 of the German patent DE 103 22 468 B3, pages 4 and 5, paragraph [0024] in amounts that the resulting polyurethane polishing pads of the examples 21 to 30 each contained 25% by weight of the solid abrasive particles (A1) to (A10). The polyol 1 samples each containing different solid abrasive particles (A1) to (A10) were reacted in accordance with the method of the example 1 of the German patent to yield the 2 mm thick polyurethane plates of the examples 21 to 30.

The polyurethane plates of the examples 21 to 30 were excellently suited as abrasive polishing pads for the CMP of Sematech 854 copper patterned wafers using the solution of the comparative experiment C1, which solution was free of abrasive particles. The abrasive polishing pads of the examples 21 to 30 caused high MRRs and high planarization efficiencies.

We claim:

1. An abrasive article, comprising:
   solid abrasive particles throughout, on top of, or throughout and on top of a solid matrix,
   wherein the solid abrasive particles are at least one type of particles selected from the group consisting of an inorganic particle, an organic particle, and an inorganic-organic hybrid particle,
   an average primary particle size of the solid abrasive particles is from 1 to 500 nm as determined by laser light diffraction, and
   the solid abrasive particles comprise an electron donor group chemically bonded to a surface of the particles,
   wherein the electron donor group is covalently bonded to the particles via a multivalent linking group selected from the group consisting of —(—O—)$_4$Si, —(—O—)$_3$Si—, —(—O—)$_2$Si<, —O—SiΞ, —(—O—)$_2$Si(—R)—, and —O—Si(—R)$_2$—,
   wherein R is a hydrogen atom or a non-reactive, monovalent, substituted or unsubstituted moiety having from 1 to 20 carbon atoms, with the proviso that R bonded to silicium is not a hydrogen atom.

2. The abrasive article of claim 1,
   wherein the inorganic particle, if present, is at least one selected from the group consisting of alumina, germania, silica, ceria, titania, zirconia, zinc oxide, silicon nitride, and silicon carbide;
   the organic particle, if present, is at least one selected from the group consisting of melamine, a melamine derivative, a melamine-formaldehyde resin, dicyandiamide, an epoxy resin, a polyurethane, a polyester, a polyamide, a polycarbonate, a polyolefin, polyvinylchloride, a polystyrene, a polyacrylate, a polymethacrylate, and any copolymer, graft copolymer, or blend thereof; and
   the inorganic-organic hybrid particle, if present, is an inorganic particle coated with at least one polymer selected from the group consisting of an epoxy resin, a melamine-formaldehyde resin, a polyurethane, a polyester, a polyamide, a polycarbonate, a polyolefin, polyvinylchloride, a polystyrene, a polyacrylate, a polymethacrylate, and any copolymer, graft copolymer, or blend thereof; an organic particle coated with at least one substance selected from the group consisting of alumina, germania, silica, ceria, titania, zirconia, zinc oxide, silicon nitride, and silicon carbide; a particle consisting of at least one inorganic particle and at least one organic particle; or any combination thereof.

3. The abrasive article of claim 1,
wherein the electron donor group is at least one selected from the group consisting of a primary amino group, a secondary amino group, a tertiary amino group, a primary phosphane group, a secondary phosphane group, a tertiary phosphane group, a hydrazine group, an oxime group, a biuret group, a carbonyl group, a hydroxyl group, a thiol group, a sulfanyl group, an ether group, a thioether group, a carboxylic ester group, a sulfonic ester group, a phosphonic ester group, a phosphate ester group, an anionic group derived from a carboxylic ester group, an anionic group derived from a sulfonic ester group, an anionic group derived from a phosphonic ester group, an anionic group derived from a phosphate ester group, an aminomethylene carboxylic acid group, a phosphonic acid group, an anionic group derived from an aminomethylene carboxylic acid group, and an anionic group derived from a phosphonic acid group.

4. The abrasive article of claim 1,
wherein the solid matrix comprises a three-dimensional structure comprising the abrasive particles and
the three-dimensional structure is a woven or nonwoven cloth, a woven or nonwoven textile, a foam, a compact material, or a combination thereof.

5. The abrasive article of claim 1,
wherein the solid matrix is bonded to a backing material.

6. The abrasive article of claim 1,
wherein the solid matrix has a polishing surface and wherein the polishing surface is patterned.

7. A method for manufacturing an abrasive article according to claim 1, the method comprising:
distributing solid abrasive particles throughout, on top of, or throughout and on top of a solid matrix,
wherein the particles are at least one kind of solid abrasive particles selected from the group consisting of an inorganic particle, an organic particle, and an inorganic-organic hybrid particle,
an average primary particle size of the solid abrasive particles is from 1 to 500 nm as determined by laser light diffraction, and
the solid abrasive particles comprise an electron donor group chemically bonded to a surface of the particles.

8. The method of claim 7,
wherein the solid abrasive particles are obtained by a process comprising reacting reactant particles with a modifier,
the reactant particles are at least one kind of particles selected from the group consisting of an inorganic particle, an organic particle, and an inorganic-organic hybrid particle,
an average primary particle size of the reactant particles is from 1 to 500 nm as determined by laser light diffraction,
the reactant particles comprise a reactive functional group,
the modifier is of formula I:

(X—)$_m$(a3)(-Y)$_n$ (I), m is an integer from 1 to 3,
n is an integer from 1 to 20,
X is a moiety comprising a complementary reactive functional group capable of reacting with the reactive functional group on the reactant particles;
a3 is a multivalent linking group, and
Y is a moiety comprising the electron donor group.

9. The method of claim 7,
wherein the inorganic particle, if present, is at least one selected from the group consisting of alumina, germania, silica, ceria, titania, zirconia, zinc oxide, silicon nitride, and silicon carbide;
the organic particle, if present, is at least one selected from the group consisting of melamine, a melamine derivative, a melamine-formaldehyde resin, dicyandiamide, an epoxy resin, a polyurethane, a polyester, a polyamide, a polycarbonate, a polyolefin, polyvinylchloride, a polystyrene, a polyacrylate, a polymethacrylate, and any copolymer, graft copolymer, or blend thereof; and
the inorganic-organic hybrid particle, if present, is an inorganic particle coated with at least one polymer selected from the group consisting of an epoxy resin, a melamine-formaldehyde resin, a polyurethane, a polyester, a polyamide, a polycarbonate, a polyolefin, polyvinylchloride, a polystyrene, a polyacrylate, a polymethacrylate, and any copolymer, graft copolymer, or blend thereof; an organic particle coated with at least one substance selected from the group consisting of alumina, germania, silica, ceria, titania, zirconia, zinc oxide, silicon nitride, and silicon carbide; a particle consisting of at least one inorganic particle (a1a) and at least one organic particle; or any combination thereof.

10. The method of claim 8,
wherein the reactive functional group is at least one selected from the group consisting of a hydroxyl group and an amino group.

11. The method of claim 8,
wherein X is of formula II:

—Si(—R)$_p$(-a5)$_{3-p}$ (II);

R is a non-reactive, monovalent, substituted or unsubstituted moiety having from 1 to 20 carbon atoms;
p is 0, 1 or 2;
a5 is a complementary reactive functional atom selected from the group consisting of hydrogen, fluorine, chlorine, bromine, and iodine; or a complementary reactive functional group of formula III:

—Z—R (III); and

Z is a bifunctional linking group selected from the group consisting of —O—, —S—, —C(O)—, —C(S)—, —O—C(O)—, —S—C(O)—, —O—C(S)—, —NH—, and —NR—.

12. The method of claim 11,
wherein X is selected from the group consisting of trihydroxysilyl, trimethoxysilyl, and triethoxysilyl.

13. The method of claim 8,
wherein Y consists of the electron donor group.

14. The method of claim 8,
wherein the modifier is selected from the group consisting of:
3-(2-(2-aminoethylamino)ethylamino)-propyltrimethoxysilane (AEPTS),
3-(2-(2-aminoethylamino)ethylamino)-propyltriethoxysilane,
N-(2-aminoethyl)-3-aminopropyltrimethoxysilane,
N-(2-aminoethyl)-3-aminopropyltriethoxysilane,
3-aminopropyltrimethoxysilane,
3-aminopropyltriethoxysilane,
3-(2-imidazoline-1-yl)-propyltriethoxysilane (IPTS),
3-(2-imidazoline-1-yl)-propyltrimethoxysilane, bis(2-hydroxyethyl)-3-aminopropyltriethoxysilane (BHAP),
bis(2-hydroxyethyl)-3-aminopropyltrimethoxysilane,
35% 3-(trihydroxysilyl)-1-propane sulfonic acid in water (TSPS),
diethylphosphatoethyl triethoxysilane (DPEOS),
diethylphosphatoethyl trimethoxysilane (DPEOS),
42% 3-(trihydroxysilyl)propyl methylphosphonate monosodium salt in water (TSMP),
3-(triethoxysilyl)propyl succinic anhydride (TPSA),
3-(trimethoxysilyl)propyl succinic anhydride
3-mercapto-propyltrimethoxysilane,
3-mercapto-propyltriethoxysilane,
3-ureidopropyltrimethoxysilane,
3-ureidopropyltriethoxysilane,
N-benzyl-N-(2-aminoethyl)-3-aminopropyltrimethoxysilane,
N-benzyl-N-(2-aminoethyl)-3-aminopropyltriethoxysilane,
N-(n-butyl)-3-aminopropyltrimethxysilane,
N-(n-butyl)-3-aminopropyltriethxysilane,
2-[metoxy(polyethyleneoxy)-propyltrimethoxysilane,
2-[metoxy(polyethyleneoxy)-propyltriethoxysilane,
3-glycidyloxypropyltrimethoxysilane,
3-glycidyloxypropyltriethoxysilane,
(N,N-dimethylaminopropyl)trimethoxysilane (DAPMS), and
(N,N-dimethylaminopropyl)triethoxysilane,
(N,N-diethylaminopropyl)trimethoxysilane,
(N,N-diethylaminopropyl)triethoxysilane,
45% N-(triethoxysilylpropyl)ethylenediamine triacetic acid trisodium salt in water, and
45% N-(trimethoxysilylpropyl)ethylenediamine triacetic acid trisodium salt in water.

15. The method of claim 7,
wherein distributing the solid abrasive particles comprises distributing the solid abrasive particles as a finely divided particulate material, as a suspension in a liquid medium, or as a concentrated solid blend.

16. A method for processing a substrate, the method comprising:
contacting a surface of the substrate with the abrasive article of claim 1 and at least one liquid chemical mechanical polishing agent, and
chemically and mechanically polishing the surface for a time sufficient to achieve planarization,
wherein the substrate is suitable for fabricating an electrical or optical device.

17. The method of claim 16,
wherein the substrate is suitable for a semiconductor integrated circuit (IC); a liquid crystal panel; an organic electroluminescent panel; a printed circuit board; a micro machine; a DNA chip; a micro plant; a magnetic head; an optical glass; an inorganic electro-conductive film; an optical integrated circuit; an optical switching element; an optical waveguide; an optical monocrystal; a solid laser monocrystal; a sapphire substrate suitable for a blue laser LED; a semiconductor monocrystal; and a glass substrate suitable for a magnetic disk.

18. The abrasive article of claim 1, wherein more than 50% of the outer surface of the solid abrasive particles carries electron donor groups.

19. The abrasive article of claim 1, wherein the electron donor group is at least one selected from the group consisting of a primary phosphane group, a secondary phosphane group, a tertiary phosphane group, a hydrazine group, an oxime group, a biuret group, a carbonyl group, a hydroxyl group, a thiol group, a sulfanyl group, an ether group, a thioether group, a carboxylic ester group, a sulfonic ester group, a phosphonic ester group, a phosphate ester group, an anionic group derived from a carboxylic ester group, an anionic group derived from a sulfonic ester group, an anionic group derived from a phosphonic ester group, an anionic group derived from a phosphate ester group, an aminomethylene carboxylic acid group, a phosphonic acid group, an anionic group derived from an aminomethylene carboxylic acid group, and an anionic group derived from a phosphonic acid group.

20. The abrasive articles according to claim 1, wherein the abrasive particles comprise moieties consisting of an electron donor group (a2) and a bivalent linking group (a3) having a multivalent group (a31) are —(—O—)$_3$Si— groups.

21. The abrasive articles according claim 20, wherein the silicon atom is directly connected to at least one of the following moieties:
3-[2-(2-aminoethylamino)ethylamino]-propyl,
N-(2-aminoethyl)-3-aminopropyl,
3-aminopropyl,
3-(2-imidazoline-1-yl)-propyl,
3-[bis(2-hydroxyethyl)amino]propyl,
3-(sulfonic acid)-propyl,
2-(diethylphosphato)-ethyl,
3-(methylphosphonate monosodium salt)-propyl,
3-(succinic anhydride)-propyl,
3-mercapto-propyl
3-ureidopropyl,
N-benzyl-N-(2-aminoethyl)-3-aminopropyl,
N-(n-butyl)-3-aminopropyl,
2-[metoxy(polyethyleneoxy)-propyl
3-glycidyloxypropyl,
3-(N,N-dimethylamino)-propyl,
3-(N,N-diethylamino)-propyl, or
3-(N-(triacetic acid trisodium salt)ethylenediamine)-propyl.

22. The abrasive articles according to claim 1, which are prepared by a process comprising:
distributing solid abrasive particles throughout, on top of, or throughout and on top of a solid matrix,
wherein the particles are at least one kind of solid abrasive particles selected from the group consisting of an inorganic particle, an organic particle, and an inorganic-organic hybrid particle,
an average primary particle size of the solid abrasive particles is from 1 to 500 nm as determined by laser light diffraction, and
the solid abrasive particles comprise an electron donor group chemically bonded to a surface of the particles,
wherein the solid abrasive particles are obtained by a process comprising reacting reactant particles with a modifier,
the reactant particles are at least one kind of particles selected from the group consisting of an inorganic particle, an organic particle, and an inorganic-organic hybrid particle,
an average primary particle size of the reactant particles is from 1 to 500 nm as determined by laser light diffraction,
the reactant particles comprise a reactive functional group,
the modifier is of formula I:

$$(X\text{-})_m(a3)(\text{-}Y)_n \qquad (I),$$

m is an integer from 1 to 3,
n is an integer from 1 to 20,
X is a moiety comprising a complementary reactive functional group capable of reacting with the reactive functional group on the reactant particles;

a3 is a multivalent linking group, and

Y is a moiety comprising the electron donor group.

23. The abrasive particles according to claim 22, wherein X is of formula II:

$$—Si(—R)_p(-a5)_{3-p} \quad (II);$$

R is a non-reactive, monovalent, substituted or unsubstituted moiety having from 1 to 20 carbon atoms;

p is 0, 1 or 2;

a5 is a complementary reactive functional atom selected from the group consisting of hydrogen, fluorine, chlorine, bromine, and iodine; or a complementary reactive functional group of formula III:

$$—Z—R \quad (III); \text{ and}$$

Z is a bifunctional linking group selected from the group consisting of —O—, —S—, —C(O)—, —C(S)—, —O—C(O)—, —S—C(O)—, —O—C(S)—, —NH—, and —NR—.

\* \* \* \* \*